United States Patent [19]

Arai

[11] 3,868,718

[45] Feb. 25, 1975

[54] FIELD EFFECT TRANSISTOR HAVING A PAIR OF GATE REGIONS

[75] Inventor: Michio Arai, Tokyo, Japan

[73] Assignee: Sony Corporation, Tokyo, Japan

[22] Filed: June 26, 1973

[21] Appl. No.: 373,731

[30] Foreign Application Priority Data

June 30, 1972 Japan .............................. 47-66070
Jan. 10, 1973 Japan .............................. 48-5700

[52] U.S. Cl. .................. 357/22, 307/300, 307/304, 357/14, 357/33, 357/40, 357/41

[51] Int. Cl. .................. H01l 11/00, H01l 15/00

[58] Field of Search .................. 307/251, 300, 304; 317/234 UA, 235 A, 235 G, 235 W

[56] References Cited

UNITED STATES PATENTS

| | | | |
|---|---|---|---|
| 2,778,956 | 1/1957 | Dacey et al. | 317/235 |
| 3,325,654 | 6/1967 | Mrazek | 307/320 |
| 3,366,802 | 1/1968 | Hilbiber | 317/235 |
| 3,407,315 | 10/1968 | Greefkes | 317/235 |
| 3,543,052 | 11/1970 | Kahng | 307/251 |
| 3,585,462 | 6/1971 | Lehovec | 317/235 |

*Primary Examiner*—Andrew J. James
*Attorney, Agent, or Firm*—Hill, Gross, Simpson, Van Santen, Steadman, Chiara & Simpson

[57] ABSTRACT

A semiconductor device includes a semiconductor substrate of one conductivity type, two electrodes formed on the substrate, a first gate region formed in the substrate and having an opposite conducitivity to the substrate, and a second gate region formed in the first gate region of the opposite conductivity type of said first region to form a PN junction therebetween. When a control signal is applied to the second gate region and the PN junction is reversely biased, an electric charge is stored within the first gate region.

12 Claims, 12 Drawing Figures

FIELD EFFECT TRANSISTOR HAVING A PAIR OF GATE REGIONS

BACKGROUND OF THE INVENTION

1. Field of the Invention

This invention relates to a semiconductor device, and more particularly to a semiconductor device in which applied signals can be stored.

2. Description of the Prior Art

Recently, a MOS field effect transistor (MOSFET) or a junction type field effect transistor (J-FET) has been widely used in the electronic field. However, the conventional J-FET has the disadvantage that its characteristic depends on the potential relationship of the drain electrode to the source electrode, and therefore, its application is limited. Moreover, while the MOSFET and the J-FET are applicable to a memory circuit or a wave-shaping circuit, they have been necessarily employed in combination with a large capacity and/or resistance. It is complicated to manufacture the capacity and/or resistance which is formed integrally with the FET on a semiconductor substrate, and in such a case, the number of the FETs formed on a semiconductor substrate is small.

SUMMARY OF THE INVENTION

An object of this invention is to provide a semiconductor device which will constitute a time-constant circuit.

Another object of this invention is to provide a semiconductor device for constituting a time-constant circuit provided with means to control the time constant.

Another object of this invention is to provide a novel semiconductor device for converting energy such as light or heat into an electricity.

Another object of this invention is to provide a novel J-FET normally operating at both positive and negative voltages between a drain electrode and a source electrode.

In a semiconductor device according to this invention, a control-signal is applied to the gate region of a J-FET or a MOSFET through a PN-junction. When the PN-junction is forwardly biased, the semiconductor device operates as a normal FET. When the PN-junction is reversely biased, an electric charge is stored within the gate region of the FET. Different time-constant circuits are constituted by control of the gate voltage through a physical or electrical control of the electric charge stored with the gate region.

DESCRIPTION OF THE PREFERRED EMBODIMENTS

Figure 1:
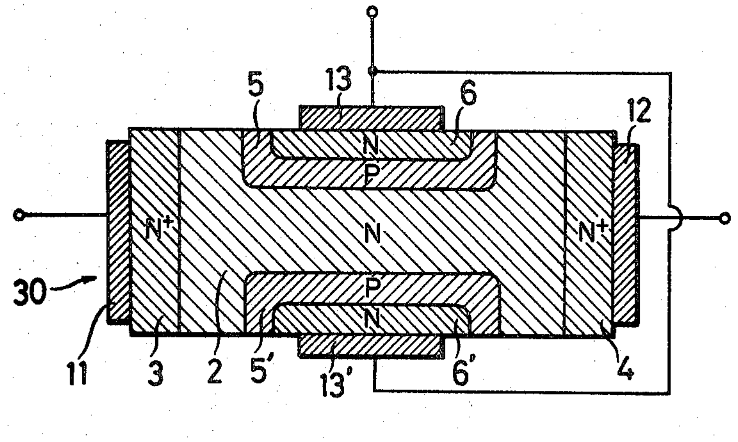
FIG. 1 is a schematic cross-sectional view of a first preferred emobodiment of a semiconductor device according to this invention.

Referring to FIG. 1, the basic operation of a J-FET with an N-type channel, according to this invention, will be described.

In this first preferred embodiment of the invention, the FET 30 comprises an N-type channel 2 of high resistivity, an $N^+$-type source region 3 of low resistivity and an $N^+$-type drain region 4 of low resistivity. The $N^+$-type source region 3 and the $N^+$-type drain region 4 are contiguous with the opposite ends of the channel 2. P-type first gate regions 5 and 5' are formed above and under the N-type channel 2, respectively.

N-type second gate regions 6 and 6' are formed in the first gate regions 5 and 5', respectively. A source electrode 11, a drain electrode 12 and gate electrodes 13 and 13' are formed on the source region 3, the drain region 4 and the second gate regions 6 and 6', respectively.

A negative potential with respect to the source electrode 11 is applied to the gate electrode 13 in operation. When a positive potential with respect to the source electrode 11 is applied to the drain electrode 12, the depletion layer, formed between the first gate region 5 and the channel 2, controls the width of the channel 2 and the J-FET 30 operates normally.

Next, when a sufficiently high negative potential with respect to the source electrode 11 is applied to the drain electrode 12, the PN-junction between the first gate region 5 and the channel 2 is forwardly biased, while the PN-junction between the second gate region 6 and the first gate region 5 is reversely biased, so that an excess current does not flow between the gate electrode 13 and the drain electrode 12.

Figure 2:
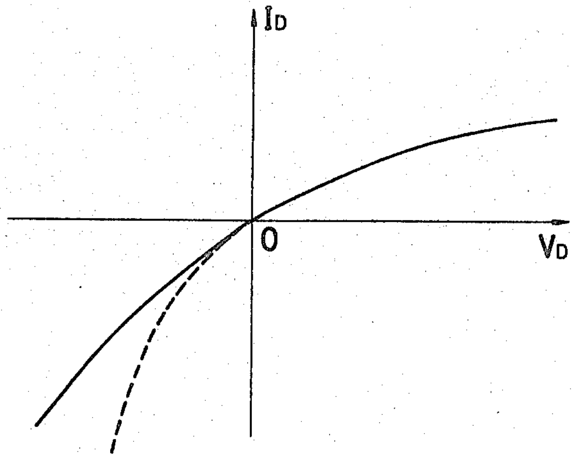
FIG. 2 shows characteristic curves for explaining operation of a semiconductor device according to this invention.

As shown by a solid line in FIG. 2, a nearly linear relationship between a drain voltage $V_D$ and a drain current $I_D$ can be obtained with both positive and negative drain voltage $V_D$, according to this invention. The dotted line in FIG. 2 shows the characteristic of the conventional FET in which an excess current flows in the negative drain voltage $V_D$ direction.

Figure 3:
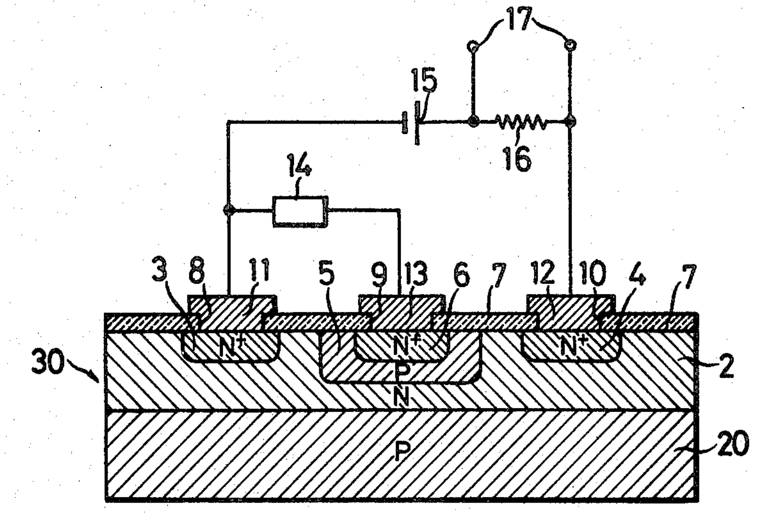
FIG. 3 shows a cross sectional view and a connection diagram of a second preferred embodiment of a semiconductor device according to this invention.

Next, a second preferred embodiment of the FET according to this invention will be described with reference to FIG. 3.

An epitaxial layer constituting an N-type channel 2 and containing N-type impurities at the density of about $10^{15}$ $cm^{-3}$, is formed on a P-type semiconductor substrate 20. A semiconductor region as the first gate region 5 containing P-type impurities at a density of about $10^{18}$ $cm^{-3}$, is formed by diffusion to a thickness of about 5 microns in the epitaxial layer of semiconductor region 2. A semiconductor region, as the second gate region 6, containing N-type impurities with a density of about $10^{20}$ cm$^{-3}$ is formed by diffusion to a thickness of about 1 micron in the P-type region 5. $N^+$-type regions, as the source region 3 and and the drain region 4, are formed at both sides of the P-type region 5.

A transparent insulating layer 7 of $SiO_2$ is formed on the surface of the semiconductor substrate formed as above described. The source electrode 11, the gate electrode 13 and the drain electrode 12 are disposed at openings 8, 9 and 10 formed on the insulating layer 7, respectively. Moreover, the FET 30 is formed so that a portion of a metal electrode exists above the P-type region 5 as little as possible. In other words, it is formed so that light incident on the FET 30 reaches the junction between the P-type region 5 and the N-type region 2 as much as possible.

And in this embodiment, a gate control circuit 14 is connected between the source electrode 11 and the gate electrode 13. A resistor 16 and an electric source 15 are connected in series between the source electrode 11 and the drain electrode 12. Output terminals 17 are connected to the both ends of the resistor 16.

Next, the J-FET 30 will be described with respect to a method of use and operation.

Figures 4A, 4B, 4C:
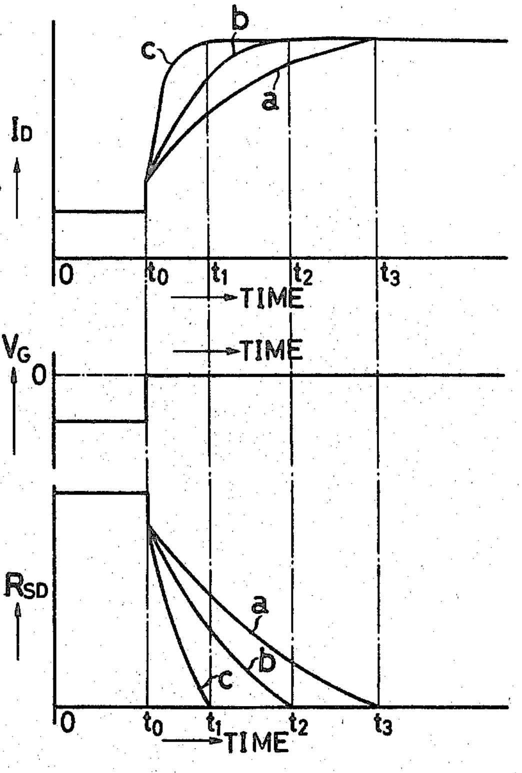
FIGS. 4A to 4C show characteristic curves for explaining the operation of a semiconductor device according to this invention.

When a negative voltage $V_G$ with respect to the source electrode 11 is applied to the gate electrode 13 by the gate control circuit 14, the junction between the $N^+$-type semiconductor region 6 and the P-type semiconductor region 5 is forwardly biased, while the junction between the P-type semiconductor region 5 and the N-type semiconductor region 2 is reversely biased. Accordingly, the whole gate voltage $V_G$ is supplied across the PN-junction between the P-type semiconductor region 5 and the N-type semiconductor region 2 to widen the depletion layer adjacent to the PN-junction, so that the channel from the $N^+$-type semiconductor source region 3 to the $N^+$-type semiconductor drain region 4 is narrowed to increase the value of the resistance therebetween. Hence, the operation is the same as that of the conventional FET. As shown in FIGS. 4A to 4C, the negative gate voltage $V_G$ is applied to the gate electrode 13 and drain current $I_D$ is smaller because of the higher value $R_1$ of the resistance $R_{SD}$ of the channel, for a time interval of 0 to $t_0$.

Until time $t_0$, the depletion layer between the P-type semiconductor region 5 and the N-type semiconductor region 2 forms a capacitance $C_1$ to be charged by the electric charge $Q = C_1 \cdot V_G$ in the P-type semiconductor region 5.

Figure 5:
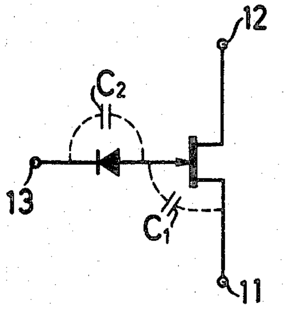
FIG. 5 shows a circuit equivalent of a semiconductor device according to this invention.

When the potential of the $N^+$-type semiconductor region 6 becomes zero, or a short circuit is formed between the gate electrode 13 and the source electrode 11, the electric charge $Q$ is shared by the capacitance $C_1$ between the regions 5 and 2, and a capacitance $C_2$ between the regions 5 and 6. As shown in FIG. 5, the J-FET 30 is equivalent to a circuit in which the capacitances $C_1$ and $C_2$ are connected in series with each other. From the view of the relationship between the P-type semiconductor region 5 and the earth level, the capacitances $C_1$ and $C_2$ are connected in parallel with each other. Therefore, $Q = Q_1 + Q_2 = C_1V_x + C_2V_x$, where the reverse-bias voltage $V_x = V_G \times C_1/C_1 + C_2$. The depletion layer due to the voltage $V_x$ remains in the channel. The resistance $R_{SD}$ between the source region 3 and the drain region 4 does not repidly decrease, but the stored charge is gradually lost by the reverse-current flowing through the PN-junctions represented by the $C_1$ and $C_2$. Since the stored charge is shared by both PN-junctions on the zero of the gate voltage $V_G$, the $R_{SD}$ decreases stepwise at the instant when the gate voltage $V_G$ becomes zero, and it gradually decreases thereafter.

When no light falls on the J-FET 30, the drain current $I_D$ gradually increases or the source-drain resistance $R_{SD}$ relatively gradually decreases, as shown by curves *a* in FIGS. 4A and 4C. In FIGS. 4A to 4C, a time interval $t_0$ - $t_3$ is about one second at a room temperature, one hundred seconds at a lower temperature, for example, at −20°C, and 1 milli-seconds at a higher temperature, for example, at 100°C.

On the other hand, when light falls on the J-FET 30, carriers (pairs of an electron and a hole) are generated adjacent to the reverse-biased depletion layer, so that the reverse-current flowing throught the PN-junctions is increased and the time $t_D$ of losing the stored charge is shortened. For example, at the intensity of illumination of 1,000 lux, the time interval $t_0$ - $t_3$ is under 0.1 millisecond. Curves *b* in FIGS. 4A and 4C show characteristics at a low intensity of illumination, and curves *c* in FIGS. 4A to 4C show characteristics at a high intensity of illumination. For example, the source drain resistance $R_{SD}$ is damped to $R_2$ in one second at the temperature of 20°C without incident light, while it is damped in 0.1 second at the intensity of illumination of 1 lux, and in 0.01 second at the intensity of illumination of 10 lux, at the same temperature.

Consequently, the time when the $R_{SD}$ reaches the constant value $R_2$ vary as $t_1$ $t_2$ $t_3$ , as shown in FIGS. 4A and 4C.

Figure 6:
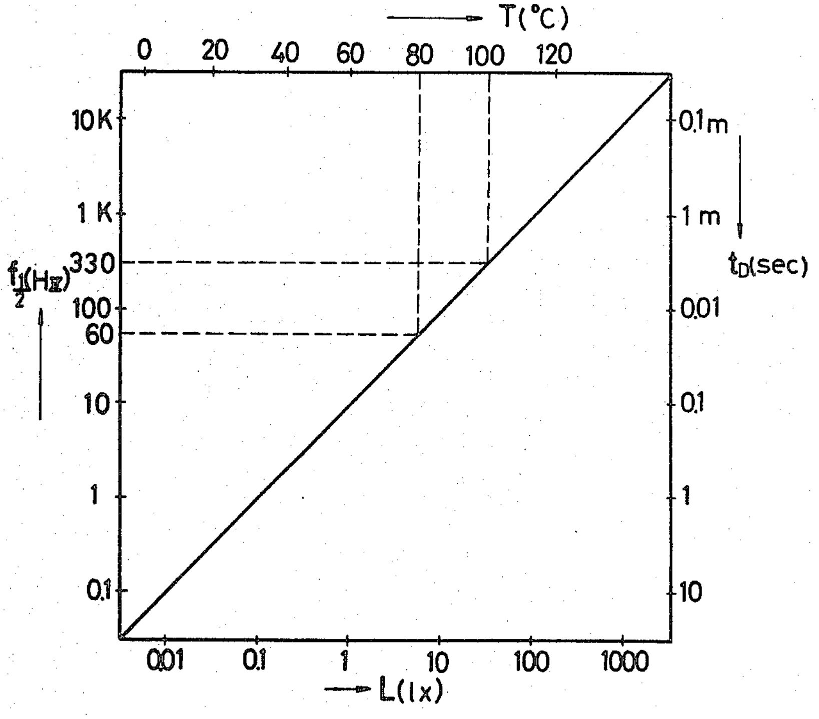
FIG. 6 is a graphical representation for explaining operation of a semiconductor device according to this invention.

FIG. 6 shows a damping-characteristic with respect to the intensity of illumination L and the temperature T. It is understood that the damping time $t_D$ of the J-FET 30 varies proportionally to the intensity of illumination L or the temperature T, and hence the FET 30 can be adapted for use in a light-responding device or a heat-responding device.

In the above description, the DC voltage is applied to the gate electrode 13 and thereafter the gate electrode 13 is put into the zero-potential state. However, when an AC voltage is applied to the gate electrode 13 by the gate control circuit 14, it is possible to obtain a light-responding device and a heat-responding device.

Figures 7A, 7B:
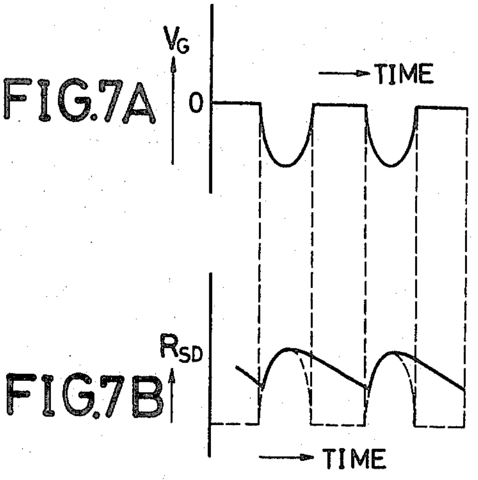
FIG. 7A and FIG. 7B show wave-forms of a gate voltage and a resistance between a source electrode and a drain electrode, for explaining the operation of a semiconductor device according to this invention, respectively.

When a gate voltage $V_G$ as shown in FIG. 7A is applied to gate electrode 13, the resistance $R_{SD}$ of the channel changes in a wave form corresponding nearly to the gate voltage $V_G$ in the conventional FET without the charge-storing effect, as shown by a dotted line in FIG. 7B. On the other hand, as the J-FET 30 according to this invention has the charge-storing effect, the $R_{SD}$ lags behind the gate voltage $V_G$, as shown by a solid line in FIG. 7B. The lag depends on the intensity of illumination and the temperature. Since the magnitude of the source-drain resistance $R_{SD}$ corresponds to that of the current flowing therethrough, the source-drain resistance $R_{SD}$ can be detected in the form of a current or a voltage from the load resistor 16. The lag can be checked by the DC component, or AC component, of the voltage which is detected by the resistor 16. The higher the intensity of illumination, the smaller the DC component, and the lower the intensity of illumination, the larger the DC component. Moreover, the higher the temperature, the smaller the DC component, and the lower the temperature, the larger the DC component.

Figure 8:
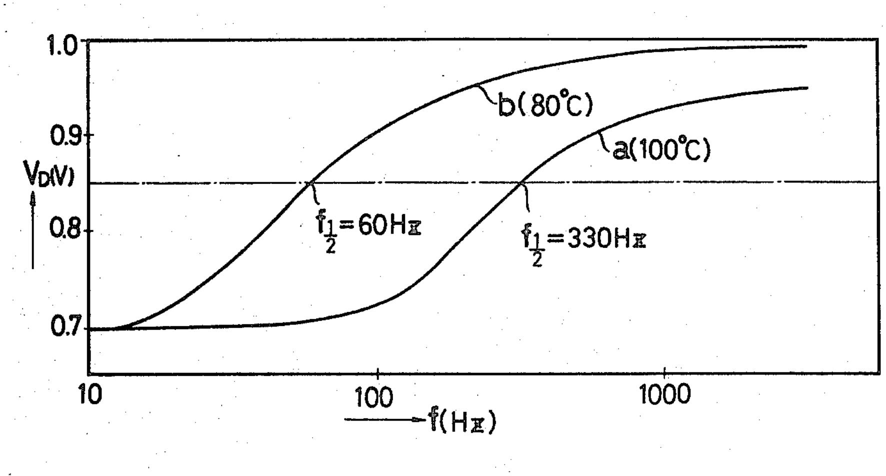
FIG. 8 shows the frequency characteristic of a semiconductor device according to this invention.

FIG. 8 shows frequency characteristics of the FET 30, which represents the relationship between the frequency of the gate voltage and the DC output when no light is incident on the FET 30. Curve *a* in FIG. 8 represents the characteristic at the temperature of 100°C, and curve *b* represents the characteristic at the temperature of 80°C. As shown in FIG. 8, $f_{1/2}$ varies with the temperature. $f_{1/2}$ represents the frequency where the DC output $V_D$ is at the middle (0.85V) between the DC output (1.0V) at the infinitely large gate frequency and the DC output (0.7V) at the infinitely small gate frequency. The 0.85V-line of the DC-output intersects with the curve *a* for the temperature of 100°C at the frequency $f_{1/2}$ of 330 Hz, and with the curve *b* for the temperature of 80°C at the frequency $f_{1/2}$ of 60 Hz. When the frequencies $f_{1/2}$ are measured at many temperature points, the relationship as shown in FIG. 6 can be obtained. And the relationship between the intensity of illumination and the frequency $f_{1/2}$, is similar to the relationship between the temperature and the frequency $f_{1/2}$, as shown in FIG. 6. Since the intensity of illumination and the temperature can be detected from the response to AC signals, it is simple to arrange a circuit controlled by light or heat or a circuit for detecting light or heat.

Figure 9:
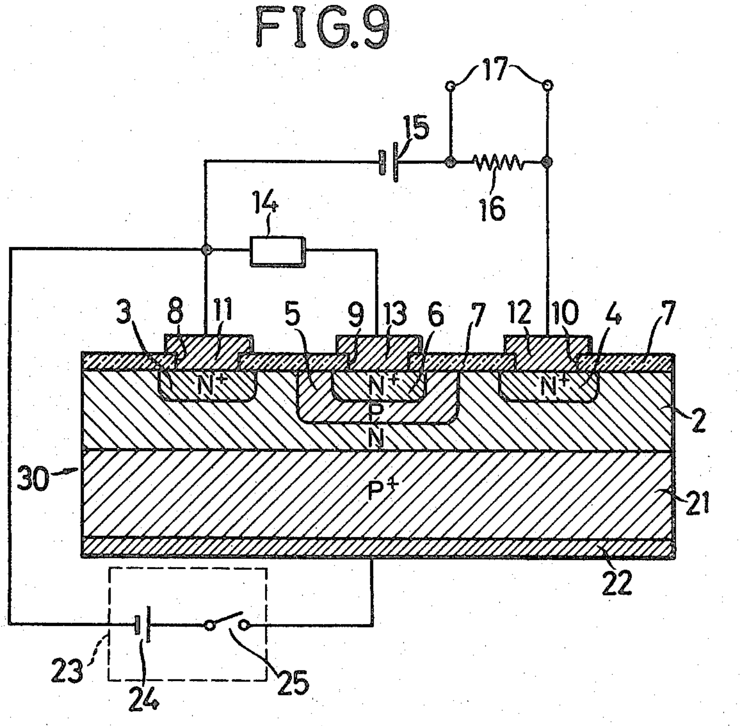
FIG. 9 shows a cross sectional view and a connection diagram of a third preferred embodiment of a semiconductor device according to this invention.

Next, the third preferred embodiment of this invention will be described with reference to FIG. 9. The parts in the third preferred embodiment which are in common with the parts in the first and the second preferred emobdiments carry the same reference numerals, and they will not be described in detail.

In this embodiment, the stored charge is not decreased by incident light, but it is decreased by newly arranged $P^+$-type semiconductor region 21, an electrode 22 of the $P^+$-type semiconductor region 21, and a control circuit 23 comprising an electric source 24 and a switch 25 are connected in series between the electrode 22 and the source electrode 11.

When a negative gate voltage $V_G$ is applied to the gate electrode 13 and thereafter the gate electrode 13 is put into zero potential, an electric charge is stored in the P-type semiconductor region 5. If the stored electric charge is not controlled, it decreases with the reverse current. However, it is controlled in this embodiment by the hereinafter described method.

In this embodiment, holes are injected from the $P^+$-type semiconductor region 21 in the ON-state of the switch 25. The holes reach the P-type semiconductor region 5 when the thickness of the region 2 is smaller than the diffusion length of the holes. Thus, the stored electric charge is decreased in the same manner as due to the carriers formed by incident light or heat and the time of losing the stored electric charge can be shortened. In cooperation with light or heat, the stored electric charge may be controlled by the injection of the holes from the $P^+$-type semiconductor region 21 functioning as an emitting region.

The emitting region 21 may be arranged in another form. If a distance to the region 5 is smaller than the diffusion length of the holes, the emitting region may be arranged in the region 2 adjacent to the source region 3 or the drain region 4, or in the region 6. The current flowing into the emitting region 21 is not only a DC signal, but also may be different types of AC signals, whereby different types of wave-shaping circuits can be arranged.

The concept of this invention is not limited to the J-FET of the arrangement as shown in FIG. 1. The PN-junction between the N-type region 6 and the P-type region 5 may be a separated diode, and anode of which is connected to the region 5 and the cathode of which is connected to the gate control circuit 14, to form the circuit as shown in FIG. 5 and to perform the same operation as described with reference to FIG. 1. In such a manner, a MOS FET connecting a diode to its gate electrode can perform the same operation as that of the circuit shown in FIG. 5. In this case, the electric charge stored in the gate region can be controlled at the PN-junction of the separated diode. Therefore, this invention includes also a semiconductor device comprising a semiconductor substrate having a current path portion, first and second semiconductor regions forming PN-junction therebetween, the first region being capacitively coupled to the current path portion, a control terminal connected to the second region and a layer for insulating a control electrode, said layer coupling the first region to the current path portion, whereby an electric charge is stored in the first region when the PN-junction is reversely biased.

Generally, radiation energy such as light or the like can be applied to all of the semiconductor devices according to this invention. And by employing the semiconductor device, a light-electricity conversion system such as an illuminometer, an electric shutter, an optical switch or the like can be formed. Moreover, an emitting region may be disposed in all of the semiconductor devices, and when DC current flows into the emitting region, different kinds of circuits such as a chattering-preventing circuit, a delay circuit, a wave shaping circuit, an FM-detection circuit, a peak level detection circuit and the like can be formed, depending on the kind of the gate signal. Moreover, by applying respective pulse signals to the emitting region and the gate, a circuit such as an analog memory circuit, a pulse delay circuit or the like can be formed.

The FET can be employed not only in the source earth or the drain earth, but also it can be employed in the gate earth, where signals are applied across the drain-source, and a soft-on switch can be formed by the application of pulse signals to the gate electrode. The term "soft-on" as here used means that the amplitudes of the signal increases gradually when the switch is closed. The semiconductor device according to this invention can be formed in an integrated circuit.

While this invention has been particularly shown and described with reference to preferred embodiments thereof, it will be understood by those skilled in the art that various changes in form and details may be made therein without departing from the spirit and scope of the invention.

I claim as my invention:

1. A field effect transistor having a semiconductor layer of one conductivity type, source and drain regions at opposite ends of said layer, a first gate region in said layer of the opposite conductivity type defining a channel between said source and drain regions, a second gate region is said layer of said one conductivity type separated from said channel by said first gate region, there being a PN-junction between said first and second gate regions and a second PN-junction between said channel and said first gate region, whereby when said first PN-junction is reversely biased and electric charge is stored in said first gate region such that a time delay occurs in the drain current when being switched from off to on condition.

2. A semiconductor device comprising a semiconductor substrate having a current path portion between source and drain electrodes, first and second semiconductor regions forming a first PN-junction therebetween, said first region being capacitively coupled to said current path portion, a control terminal connected to said second region, whereby an electric charge is stored in said first region when said PN-junction is reversely biased, and a second PN-junction for coupling said first region to said current path portion such that a time delay occurs in the drain current when being switched from the off to on condition.

3. A semiconductor device according to claim 2, which includes an insulating layer for coupling said first region to said current path portion.

4. A semiconductor device according to claim 2, wherein said current path portion is of an opposite conductivity type to said first region.

5. A semiconductor device according to claim 4, which includes a third region of the same conductivity type as said first region, said third region being adjacent to said current path portion.

6. A semiconductor device according to claim 4, which includes a third region of the same conductivity type as said first region, said third region being adjacent to said second region.

7. A field effect transistor having a substrate of semiconductor material of one impurity type, and epitaxial layer of the opposite impurity type on one surface of said substrate, source and drain regions formed in the outer surface of said epitaxial layer of the same impurity type as said epitaxial layer but of relatively higher impurity concentration, a first gate region in said epitaxial layer of the opposite impurity type to said epitaxial layer, a second gate region superimposed on and formed in said first gate region of opposite impurity type to said first gate region, but of relatively higher impurity concentration, a gate control circuit connected between said source region and said second gate region, a resistor, a potential source connected in series with said resistor between said source and drain regions, and output terminals connected to opposite ends of said resistor such that a time delay occurs in the drain current when being switched from the off to on condition.

8. A field effect transistor according to claim 7, in which said substrate is of relatively high impurity concentration, and in which there is an ohmic contact on the under surface of said substrate, a second potential source and a switch connecting said second potential source between said source region and said ohmic contact.

9. A field effect transistor according to claim 7, in which there is a transparent insulating layer overlying the upper surface of said epitaxial layer, there being windows through said insulating layer through which extend a source electrode, a gate electrode and a drain electrode into contact with said source region, said second gate region and said drain region respectively.

10. A semiconductor device having first, second, and third contiguous conductor regions, said contiguous regions being of opposite conductivity type, first and second PN junctions between said first and second regions and between said second and third regions, respectively, first and second terminals provided to said first region, means for biasing said second PN junction and determining the state of said second region, means for detecting the impedance between said first and second terminals determined by the state of said second region, said biasing means and said impedance means having first and second points correspond while the responding time from said first to second impedance point is substantially equal to the exciting time from said first to second biasing point and the responding time from said second to first impedance point is longer than than exciting time from said second to first biasing point.

11. A semiconductor device according to claim 10, wherein said first and second biasing points are reversely and forwardly biased, respectively.

12. A semiconductor device according to claim 10, wherein said second region stores charges therein at said first biasing point.

* * * * *